United States Patent [19]

Kelso

[11] Patent Number: 5,590,017
[45] Date of Patent: Dec. 31, 1996

[54] ALUMINA MULTILAYER WIRING SUBSTRATE PROVIDED WITH HIGH DIELECTRIC MATERIAL LAYER

[75] Inventor: John F. Kelso, Apollo, Pa.

[73] Assignee: Aluminum Company of America, Pittsburgh, Pa.

[21] Appl. No.: 415,874

[22] Filed: Apr. 3, 1995

[51] Int. Cl.$^6$ .............................. H01G 4/06; H05K 1/00
[52] U.S. Cl. ...................... 361/321.4; 361/313; 361/320; 361/321.1; 361/321.5; 361/301.4; 361/306.1; 361/306.3; 174/250; 174/261
[58] Field of Search ................... 361/301.4, 306.1, 361/306.3, 311–313, 320–321.5; 257/295; 29/25.41, 25.42; 174/250, 261–264; 365/145, 149

[56] References Cited

U.S. PATENT DOCUMENTS

| | | |
|---|---|---|
| 3,085,052 | 4/1963 | Sibert . |
| 3,201,667 | 8/1965 | Varga . |
| 3,305,394 | 2/1967 | Kaiser et al. . |
| 3,420,719 | 1/1969 | Potts . |
| 3,568,014 | 3/1971 | Schuermeyer . |
| 3,819,990 | 6/1974 | Hayashi et al. . |
| 3,969,197 | 7/1976 | Tolar et al. . |
| 4,151,008 | 4/1979 | Kirkpatrick . |
| 4,181,538 | 1/1989 | Narrayan et al. . |
| 4,229,777 | 10/1980 | Merrill et al. . |
| 4,267,014 | 5/1981 | Davey et al. . |
| 4,323,948 | 4/1982 | Mercier et al. . |
| 4,437,139 | 3/1984 | Howard . |
| 4,456,945 | 6/1984 | Shedigian . |
| 4,464,701 | 8/1984 | Roberts et al. . |
| 4,873,610 | 10/1989 | Shimizu et al. . |
| 5,099,388 | 3/1992 | Ogawa et al. . |
| 5,144,526 | 9/1992 | Vu et al. ................................ 361/321 |
| 5,189,010 | 2/1993 | Strom et al. . |
| 5,195,018 | 3/1993 | Kwon et al. . |
| 5,378,662 | 1/1995 | Tsuyuki . |
| 5,521,332 | 5/1996 | Shikata et al. ........................ 174/52.4 |

*Primary Examiner*—Bot L. Ledynh
*Attorney, Agent, or Firm*—David W. Pearce-Smith

[57] ABSTRACT

An alumina multilayer wiring substrate having a high capacitance in the substrate on which a VLSI is to be mounted to effectively eliminate electrical noise(s) which may hinder the operation of the VLSI at high speed (frequency). The wiring substrate comprises: (a) a first alumina layer; (b) a first metallized layer on the first alumina layer; (c) a dielectric material layer on the first metallized layer; (d) a cermet layer on the dielectric material layer; (e) a second metallization layer on the cermet layer; (f) a second alumina layer on the second metallization layer; (g) a first conductor electrically connecting to and extending from the second metallized layer through the second alumina layer; and (h) a second conductor electrically extending from the first metallized layer through the cermet layer and dielectric material layer, through but not electrically connecting the first metallized layer, and through the second alumina layer.

13 Claims, 1 Drawing Sheet

ALUMINA MULTILAYER WIRING SUBSTRATE PROVIDED WITH HIGH DIELECTRIC MATERIAL LAYER

FIELD OF THE INVENTION

The present invention is related to multilayer substrates. More particularly, the present invention relates to multilayer substrates having high dielectric, low inductance capacitance in the vicinity of a very large scale integrated (VLSI) chip.

BACKGROUND OF THE INVENTION

One current technological trend is to develop an integrated circuit having an operating speed (frequency) greater than that of its predecessors. Electronic noise can hinder the operation of the circuit. The noise interference is especially pronounced at the higher frequencies. To correct this problem, conventionally, the number of power lines and ground lines has been increased in proportion to the number of input/output (I/O) lines in an integrated circuit (IC) package. Following the conventional approach, as each successive VLSI is designed, the number of power lines and ground lines is greater than that of the previous design. It is predicted that the number of power lines and ground lines will eventually equal the number of I/O lines. As such, future IC packages will be physically larger and more structurally complex than their present counterparts.

A solution to this problem, as well as to many other integrated circuit problems, is to mount a capacitor chip on the IC package. Providing the IC package with a capacitive chip reduces the number of power lines and ground lines required. However, when a capacitor chip is added, the inductance of a power line/ground line loop is increased, possibly to five times the value of the inductance present when no capacitor chip is used. As a result, it is expected that five or more chip capacitors in parallel must be mounted onto the IC package to reduce that inductance. Since it is expected that the number of power line/ground line loops can only increase, given the current VLSI development trend, it is predicted that twenty or more capacitor chips would be required for an IC package given 100 power line/ground line loops. As with the conventional method of simply adding power line/ground line loops, adding chip capacitors complicates the IC package and reduces reliability and yield.

A solution to the foregoing problems is to provide a capacitor function within a multilayer wiring substrate. However, to provide the capacitor function in this manner, it has been necessary to use sheets or paste having the same composition as the substrate. It has also been necessary to laminate the conductors and the sheets or paste in multiple layers to obtain a predetermined capacitance.

U.S. Pat. No. 5,099,388 is directed to an alumina multilayer wiring substrate having a high dielectric, low inductance capacitor in the substrate on which a VLSI is to be mounted to effectively eliminate electrical noise(s) which may hinder the operation of the VLSI at high speed (frequency).

The present invention addresses a structure which further eliminates noise that may hinder the operation of the VLSI at high frequencies (speeds). It is possible to provide an alumina multilayer substrate in which a low inductance capacitor is embedded by placing a very thin ceramic sheet of high dielectric material in the vicinity of a position where the VLSI chip is to be mounted.

To obtain a large capacitance through the described multilayer lamination method, the sheet or paste layer must be made thinner or the number of laminations of the sheet or paste layer must be increased. In this process, however, there have been problems reducing the sheet or paste layer thickness below 10 μm. Moreover, increasing the number of laminations and steps increases cost. Reducing the number of laminations reduces reliability, etc.

Accordingly, it would be advantageous to provide a wiring substrate with a high capacitance.

The primary object of the present invention is to provide a method of forming a wiring substrate with a buried electrode having a high capacitance.

Another objective of the present invention is to provide a method which consistently results in the formation of wiring substrate having high capacitance.

Yet another object of the present invention is to provide a method of forming a wiring substrate having a high capacitance which results in a low incidence of shorting between the counter electrodes in the capacitors.

These and other objects and advantages of the present invention will be more fully understood and appreciated with reference to the following description.

SUMMARY OF THE INVENTION

The present invention uses a cermet and alumina-frit dielectric material to form a internal capacitor in a multilayer electronic package (alumina multilayer wiring substrate) in which at least one VLSI chip is to be mounted. The present invention incorporates a low inductance capacitor in the alumina multilayer wiring substrate to effectively eliminate noises of the VLSI. The cermet material used is a mixture of alumina, a basic material, and at least one of either molybdenum, molybdenum oxide, tungsten, or tungsten oxide. The molybdenum, chromium, tungsten, cobalt, vanadium, manganese, iron, nickel, copper, and oxides thereof and other elements or compounds added to the alumina (e.g., glass-forming materials) are generally referred to as "auxiliaries." The resultant alumina-auxiliary material is combined at a 5 to 50 wt. % ratio where the wt. % represents the amount of the auxiliaries where the total quantity of alumina and auxiliaries is assumed to be 100%. The dielectric material contains alumina and other non-conducting materials.

The alumina wiring substrates can be of various sizes and shapes depending upon the particular application. The alumina wiring substrate may be composed of any combination of materials as long as alumina is the main component. Various auxiliaries may be included depending upon the intended application.

The cermet material may contain a mixture of any one or combination of the aforementioned auxiliaries. Molybdenum or tungsten are most commonly used because of their ability to cofire with alumina.

The wiring substrate of the present invention comprises: (a) a first alumina layer; (b) a first metallized layer on the first alumina layer; (c) a dielectric material layer on the first metallized layer: (d) a cermet layer on the dielectric material layer; (e) a second metallization layer on the cermet layer; (f) a second alumina layer on the second metallization layer; (g) a first conductor electrically connecting to and extending from the second metallized layer through the second alumina layer; and (h) a second conductor electrically extending from the first metallized layer through the cermet layer and dielectric material layer, through but not electrically connecting the first metallized layer, and through the second alumina layer. The position of the dielectric layer and the cermet layer between the metallization layers are interchangeable.

The method of the present invention is a method of forming a capacitor comprising oppositely charged first and second metal layers separated by a dielectric material layer. The improvement comprises: (a) coating a thin dielectric layer on the first metal layer, the dielectric layer having at least one defect (as defined hereinafter) which would cause a conductive short in the capacitor; and (b) coating a cermet layer on the thin dielectric layer, the cermet layer containing a sufficiently low level of conductive material so that it does not contribute to the thickness of the thin dielectric layer for the purposes of capacitance and the cermet layer containing sufficient insulative material to act as a barrier to prevent the first and second metal layers from being in electrical contact as a result of the presence of the at least one conductive defect in the dielectric material.

BRIEF DESCRIPTION OF THE DRAWINGS

Other features and advantages of the present invention will become apparent from the following detailed description thereof, as well as the practice of the invention, the description between taken together with the drawing, in which.

Figure 1:
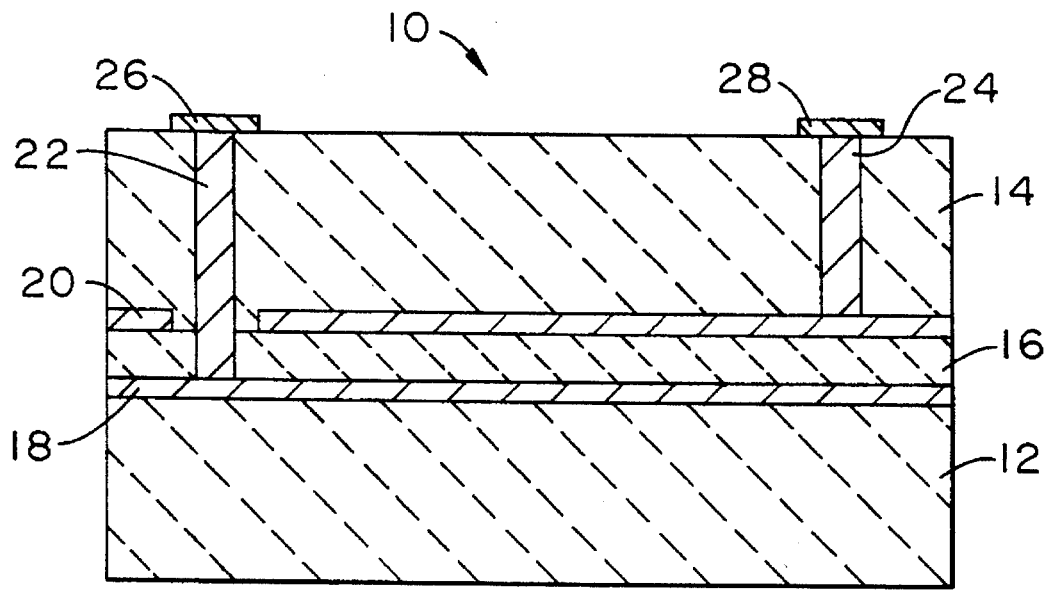
FIG. 1 is an illustration of a prior art capacitor layer.

In the drawings, the thicknesses and depths of the layers, coatings and regions are neither shown to scale nor shown exactly in accordance with their relative proportions for the convenience of illustration.

MODE FOR CARRYING OUT THE INVENTION

The term "internal capacitor" is used herein to describe a capacitor which is formed in a laminated structure. The layers of materials which form the capacitor are not exposed to the surface of the laminated structure.

The term "defect" as used herein is intended to mean any voids or surface indentation which cause a hole or local thin spot in a layer. The term is intended to include defects and voids such as pinholes, microcracks, microfissures, surface blemishes, dimples, tears and other defects known in the art.

The present invention will first be described generally. Specific examples follow the general description.

Turning first to FIG. 1, there is illustrated a prior art internal capacitor 10. The prior art internal capacitor 10 consists of a lower substrate 12 and an upper substrate 14, both preferably made of alumina, with a high dielectric material 16 disposed therebetween. On either surface of the high dielectric material are metallized layers, a lower metallized layer 18, and an upper metallized layer 20. The lower metallized layer 18 is sandwiched between the high dielectric material layer 16 and the lower alumina substrate 12. The upper metallized layer 20 is sandwiched between the high dielectric material layer 16 and the upper alumina substrate 14. Conductors 22 and 24 are connected respectively to the lower metallized layer 18 and the upper metallized layer 20. The conductors 22 and 24 extend from the metallized layers 18 and 20 respectively to the exterior surface of the upper alumina substrate 14. Electrode layers 26 and 28 are attached respectively to each of conductors 22 and 24 at the exterior surface of the upper alumina substrate 14 to provide exterior contact points. The high dielectric material layer 16, the lower metallized layer 18, and the upper metallized layer 20 are collectively called the capacitor layer.

The capacitance of the capacitor layers is calculated according to the general formula for calculating the capacitance of a multilayer parallel plate capacitor as either of the two following equations:

$$C = \epsilon(A/d) \text{ or } C/A = nK\epsilon_o/d$$

Where:

A is the area of the parallel plates;

d is the distance between the electrodes;

$\epsilon$ is the premitivity or the product of the constant $\epsilon_o = 8.85 \times 10^{-12}$ (farad/meter)K;

n is the number of electrode pairs; and

K is the dielectric constant of the material.

Therefore, the capacitance is inversely related to the distance (d) between metallic layers 18 and 20. There is a need for a method of manufacturing buried capacitors in electronic packages with higher capacitance. Heretofore, the increase in capacitance has been obtained by either substituting higher dielectric materials and/or by decreasing the distance between metallic layers 18 and 20.

Figure 2:
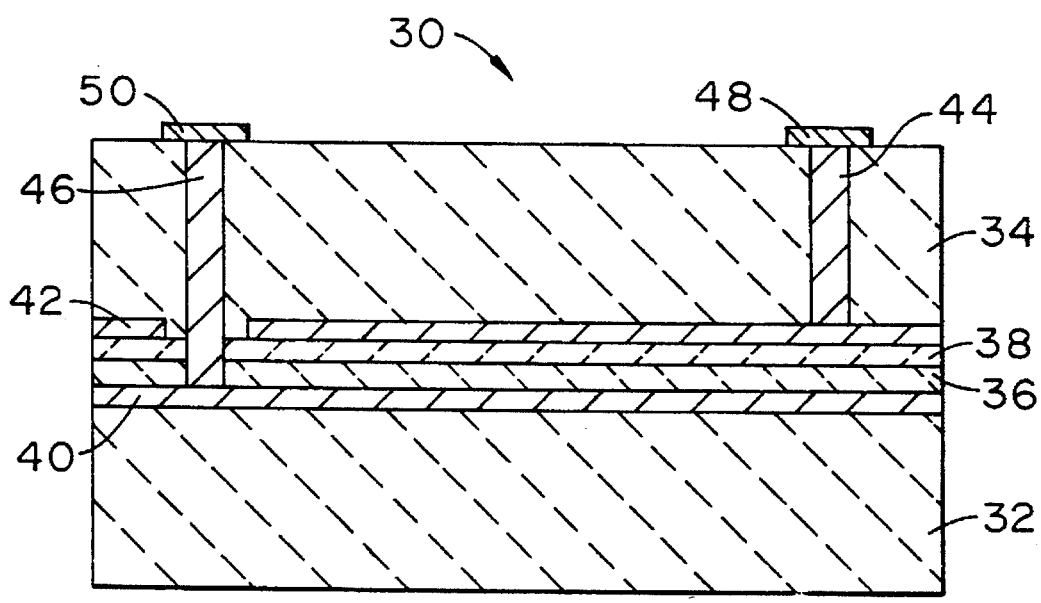
FIG. 2 is an illustration of the alumina multilayer wiring substrate showing the capacitor layers of the present invention.

Turning next to FIG. 2, an internal capacitor 30 of the present invention is shown. Internal capacitor 30 consists of a lower substrate 32 and an upper substrate 34 with a dielectric material 38 and a cermet material 36 disposed therebetween. Above dielectric material 38 is an upper metallized layer 42. The upper metallized layer 42 is sandwiched between the dielectric material layer 38 and the upper alumina substrate 34. Below cermet material layer 36 is lower metallized layer 40. The lower metallized layer 40 is sandwiched between cermet material 36 and the lower alumina substrate 32.

Conductors 44 and 46 are connected respectively to the upper metallized layer 42 and the lower metallized layer 40. Conductors 44 and 46 extend from the metallized layers 42 and 40 respectively to the exterior surface of the upper alumina substrate 34. Electrode layers 48 and 50 are attached respectively to conductors 44 and 46 at the exterior surface of the upper alumina substrate 34 to provide exterior contact points. Dielectric material layer 38, cermet layer 36, upper metallized layer 42, and lower metallized layer 40 are collectively called the capacitor layers of the present invention.

Cermet layer 36 is formulated so that for the purposes of the magnitude of the capacitance, its thickness does not contribute to the distance (d) between the metallic layers 40 and 42. The conductive particles in cermet layer 36 act to bring an electromagnetic field from adjacent metallic layer 40 closer to dielectric material layer 38 and thereby effectively eliminate the effect of the thickness of the cermet layer for the purposes of the magnitude of the measured capacitance. Therefore, the distance (d) in the general formula for calculating capacitance is virtually unaffected by the thickness of the cermet layer in the range of thicknesses used in the examples.

Unexpectedly, the ceramic particles cause cermet layer 36 to act as an electrical insulator between metallized layers 40 and 42 when cermet layer 36 is used in conjunction with dielectric material layer 38. The ceramic particles in cermet layer 36 also causes it to act as an electrical insulator, and between metallized layers 42 and the vias of opposite charge 46 pass through them. This is surprising since cermet layer 36 affects the electromagnetic fields between metallic layers 40 and 42. The distance between metallized layers 40 and 42 and vias passing through them will generally be at least three or four times the distance between layers 40 and 42. The ceramic particles in cermet layer 36 reduce the incidence of electrical shorts that occur when dielectric material layer 38 is very thin. As explained in the examples below, the incidence of electrical shorts can be virtually eliminated by decreasing the volume percent of conductive material in the cermet or by increasing the thickness of the cermet layer.

To form the cermet for multilayer high frequency circuit packages, the starting materials are milled and/or classified until they have an average particle size of 0.5–10 microns. A slurry is then formed by combining the finely ground powders (e.g., alumina, frit, $MoO_3$) with a suitable solvent and other conventional additives, such as a plasticizer and a binder, in a manner known in the art. The slurry is cast into thin "green" (unfired) sheets having a thickness of about 0.0005 to 0.002 inch using a conventional doctor blading process. Alternately, the cermet layer can be formed by other processing methods known to the art such as a slotted die coating process, screen printing, extrusion, etc.

A dielectric layer is then formed and placed adjacent to the green cermet layer. The dielectric layer is formed from alumina or an alumina-frit combination possibly containing other non-conductive materials. Preferably, the dielectric layer is at least 85 wt. % $Al_2O_3$. The dielectric layer may be formed at a location remote from the green cermet layer and then transported to the green cermet layer. Alternately, dielectric layer can be created directly on top of the green cermet layer. This can be accomplished using a second process such as doctor blade process, a slotted die coating process or a screen printing process.

After the green cermet layer and the green dielectric layer are formed into a two-layer green sheet, the green sheets are blanked into individual square sheets or cards. Via holes next are formed in the two-layer green sheets by a die punching process. The holes suitably may have a diameter of about 75–350 microns. A conductor paste is applied in a desired pattern to the punched sheets using a screen printing process. The paste is also applied within the via holes to form connections between conductor patterns. The principal metallic constituent of the paste may be molybdenum, tungsten, or other suitable materials.

The printed green sheets are then stacked in a desired sequence with other layers in the package using alignment holes to insure correct positioning and laminated together at 50°–100° C. under a pressure between about 50 and 300 psi.

Finally, the laminated green sheets are fired at a temperature between about 1500° and 1700° C. to form dense, sintered ceramic multilayer circuit substrates. The firing is performed in a reducing atmosphere to prevent the oxidation of the conductive material used to form the electrodes.

The benefit of the present invention is illustrated in the following examples. The first five examples were performed for the purpose of comparison.

EXAMPLES

As a first example of the present invention, the composition of the substrate alumina layers was made by mixing alumina, frit, binder, plasticizer, solvents and then casting the mixture into sheets and drying the formed sheet. The thickness of the substrate layers was approximately 12 mils. Via holes were punched into the tape. Subsequently, a paste containing tungsten was printed at predetermined positions onto the upper and lower surfaces of the dried alumina sheet, a process which subsequently filled in the vias with conductive material. The upper printed region became the metallized layer which acted as an electrode on one side of the capacitor. The capacitors were produced having dielectric layers formed from alumina-frit and cermet layers formed from an alumina-frit and molybdenum oxide. The dielectric layers were formed by mixing alumina and flit powders with binders, plasticizers and suitable solvents and then forming the mixture into sheets and allowing the sheets to dry. The cermet layers were formed by adding molybdenum oxide having a particle size of 10 micrometers or less to the composition used to create the dielectric layer.

The dielectric layer and cermet layer were tacked onto the substrate electrode (metallized layer) and a second electrode was screened on top of the dielectric and cermet layers. Once assembled, the entire structure was co-fired at approximately 1650° C. for approximately one hour in a reducing atmosphere.

The molybdenum oxide was reduced in a hydrogen atmosphere during firing to leave behind electrically conductive molybdenum particles in the cermet layer. Any starting material may be alternately used as long as the composition leaves conductive particles in the cermet in the appropriate positions after firing (e.g., $MoO_3$, $MoO_2$, Mo, $Al_2(MoO_4)_3$). Once produced, the capacitance values of the fired materials were measured and the average Cp/A (nF/sq.in.) were recorded on the Table. In addition, the fired materials were tested for electrical shorts. The percentage of parts which shorted is also recorded in the Table.

TABLE

| Example | $Al_2O_3$-Frit Thickness (mils) | Cermet (Mo) Thickness (mils) | Wt. % $MoO_3$ in Tape | Estimated Vol. % Mo After Fired | % of Parts Which Shorted** | Average Cp/A (nF/sq. in.) |
|---|---|---|---|---|---|---|
| 1 | 1.6 | 0 | — | — | 0 | 1.2 |
| 2 | 0.8 | 0 | — | — | 20† | 2.6† |
| 3 | 0.7 | 0 | — | — | 36† | 3.1† |
| 4 | 0.5 | 0 | — | — | 100 | 4.3* |
| 5 | 0.4 | 0 | — | — | 100 | 4.8* |
| 6 | 0 | 5.2 | 25 | 7.6 | 0 | 1.3 |
| 7 | 0 | 3.1 | 25 | 7.6 | 100 | —‡ |
| 8 | 0 | 4.9 | 30 | 9.6 | 100 | —‡ |
| 9 | 0 | 3.1 | 30 | 9.6 | 100 | —‡ |
| 10 | 0.7 | 0.8 | 25 | 7.6 | 0 | 2.5 |
| 11 | 0.5 | 0.8 | 25 | 7.6 | 0 | 3.5 |

TABLE-continued

| Example | Al$_2$O$_3$-Frit Thickness (mils) | Cermet (Mo) Thickness (mils) | Wt. % MoO$_3$ in Tape | Estimated Vol. % Mo After Fired | % of Parts Which Shorted** | Average Cp/A (nF/sq. in.) |
| --- | --- | --- | --- | --- | --- | --- |
| 12 | 0.3 | 0.8 | 25 | 7.6 | 100 | —‡ |
| 13 | 0.6 | 1.0 | 25 | 7.6 | 0 | 2.6 |
| 14 | 0.6 | 1.0 | 30 | 9.6 | 0 | 3.0 |
| 15 | 0.6 | 1.3 | 40 | 14.2 | 0 | 3.0 |
| 16 | 0.6 | 0.8 | 40 | 14.2 | 0 | 3.0 |
| 17 | 0.6 | 0.7 | 40 | 14.2 | 0 | 3.0 |
| 18 | 0.6 | 0.4 | 40 | 14.2 | 33 | 3.1 |

*electrically reworked to open shorts
**average of 3–5 parts
†average of 24 parts
‡could not be electrically reworked to open shorts Referring to the Table, Examples 1–9 are prior art examples and are presented herein for purposes of comparison. In prior art Examples 1–5, there is no cermet layer (Mo layer) between the layers of metallization. As seen in the Table, as the thickness of the dielectric layer (Al$_2$O$_3$-frit layer) decreases in Examples 1–5, the capacitance of the layers increases. In addition, as the thickness of the dielectric layer decreases, the percentage of parts which short increases. From a commercial standpoint, it is essential to have a yield as near 100% (0% shorts) as possible. Examples 1–5 reveal that the maximum capacitance, which one could obtain using the Al$_2$O$_3$-frit layer as the dielectric layer, is less than 2.6 nF/sq.in.

In Examples 6–9, there is no Al$_2$O$_3$-frit layer between the layers of metallization. The cermet layer (Mo layer) is the dielectric material. A comparison of Examples 6 and 7 reveal that for cermet layers containing ~7.6 vol. % Mo, significant amounts of shorting occurs when the thickness of the cermet layer is less than about 5.2 mils. Example 8 reveals that for cermet layers containing ~9.6 vol. % Mo, unacceptable amounts of shorting occurs when the thickness of the cermet layer is about 4.9 mils.

Examples 10–18 illustrate the benefit of the current invention over the prior art. Examples 10–12 show that as thickness of Al$_2$O$_3$-frit layer decreases, capacitance increases but eventually it is too thin and shorting occurs. In this regard, Examples 10–12 are similar to prior art Examples 1–5. Surprisingly, there were no shorts at an Al$_2$O$_3$-frit thickness of 0.5 mil (Example 11). This is unexpected in view of Example 4. The presence of a 0.8 mil thick cermet layer containing ~7.6 vol. % Mo in Examples 10–11 reduced the percentage of parts which shorted to 0%. It was only when the thickness of the Al$_2$O$_3$-frit layer was reduced to 0.3 mil (Example 12) that the parts exhibited shorts.

In Examples 13–18, the thickness of the Al$_2$O$_3$-frit dielectric layer is approximately 0.6 mil. In Examples 15–17, the thickness of the Mo cermet layer varies from 1.3 mils to 0.7 mil. Surprisingly, the presence of the cermet layer containing 14.2 vol. % Mo in Examples 15–17 reduced the percentage of parts which shorted to 0%. This is surprising since Examples 3 and 4, which had comparable thicknesses of the Al$_2$O$_3$-frit layer, had high percentages of shorts. In Examples 15–17, the presence of insulative material (85.8 vol. %) in the cermet layer was sufficient to prevent shorting between the two electrodes. It was only when the thickness of the Mo cermet layer was reduced to 0.4 mil (Example 18) that the parts exhibited shorts.

Unexpectedly, the thickness of the Mo cermet layer has no effect on the capacitance in the ranges tested in Examples 15–18. The 14.2 vol. % Mo in the cermet layer was sufficient so that it did not contribute to the thickness of the thin dielectric layer for the purposes of capacitance. The average capacitance for each of Examples 15–18 is about 3.0 nF/sq.in. which results from using K ~8 to 9 (the dielectric constant of the alumina-frit layer) and d=0.6 in the equation above regarding capacitance.

Examples 13 and 14 both have an Al$_2$O$_3$-frit dielectric layer of 0.6 mil in thickness and a cermet layer of 1.0 mil. Examples 3 and 4, which had comparable thicknesses of the Al$_2$O$_3$-frit layer, had high percentages of shorts. The presence of the cermet layer reduced the percentage of parts which shorted to 0%. In Examples 13 and 14, the presence of the insulative material (92.4 and 90.4 vol. %, respectively) in the cermet was sufficient to prevent shorting between the two electrodes.

The parts from Examples 13 and 14 have different capacitance. Example 14 has the same capacitance as Examples 15–17, which is expected since they all had an Al$_2$O$_3$-frit dielectric layer of 0.6 mil. However, Example 13 had a lower capacitance than Examples 14–17 even though they all had an Al$_2$O$_3$-frit dielectric layer of approximately 0.6 mil. Example 13 has 7.6 vol. % Mo in the 1.0 mil thick cermet layer. The low level of Mo at that thickness in Example 13 is believed to have resulted in its lower capacitance. It is further believed that there is not enough conductive material in the 1 mil thick cermet layer, and therefore it acts as an additional dielectric layer, contributing to the thickness of the dielectric layer for the purposes of capacitance.

Although not wishing to be bound by any theory it is believed that the shorting that occurs with thin dielectric layers (i.e., less than about 0.8 mil) is related to defects in the dielectric layer that form localized areas of either no dielectric material or extremely thin dielectric material between the metallized layers (electrodes). These defects may be formed during the manufacturing processes used to create the thin material or when handling thin sheets of dielectric material. It is further believed that shorting occurs in the cermet layers by electrical conduction along chains or clusters of metal particles. It is believed that as long as the volume percent of metallic particles in the cermet layer is maintained at a sufficiently low level for a given thickness, the likelihood of a continuous chain or cluster of metallic particles meeting up with the site of a defect through the thickness of the dielectric layer is unlikely, and therefore the incidence of shorting will be acceptable.

It is to be appreciated that certain features of the present invention may be changed without departing from the present invention. Thus, for example, it is to be appreciated that although the invention has been described in terms of a preferred embodiment in which an $Al_2O_3$-frit layer is used as the dielectric layer, the composition of the dielectric layer is not critical to practicing the invention as long as it is a dielectric. Compositions of the dielectric layer comprehended by the present invention include barium titanate, lead-zironate titanate, tantalates, niobates, zirconates, porcelains, glasses, glass-ceramics and other dielectric materials known in the art.

Although the usefulness of the present invention has been described to some extent in terms of ceramic dielectric materials, it is contemplated that the invention may also be used in conjunction with other dielectric materials used in the electronics industry such as Teflon, polystyrene, polyvinyl chloride, polyethylene, polyesters, polyamides, rubbers and other polymers known in the art.

Whereas the preferred embodiments of the present invention have been described in terms of alumina substrates that sandwich the internal capacitors, other substrate materials can also be used in practicing the present invention. Thus, for example the substrate may be formed from BeO, $Si_3N_4$ and other types of glass and glass ceramics known in the art.

Whereas the preferred embodiments of the present invention have been described above in terms of being especially valuable in terms of a preferred embodiment in which Mo is used as the conductor in the cermet layer, the composition of the components of the cermet layer is not critical to practicing the invention. Conductive materials for use in the cermet layer comprehended by the present invention include metals (tungsten, aluminum, silver, gold, palladium, magnesium, copper, iron, zinc, nickel, cobalt, titanium, and alloys formed therefrom) and other conductive materials known in the an such as carbon black in polymers.

Whereas the preferred embodiments have been described in terms of an alumina system with tungsten metal layers, it is contemplated that other ceramic package systems known in the art can be used in conjunction with the present invention. Other material systems include borosilicate glass and glass-ceramic systems with metallization layers of gold, silver, palladium, copper and alloys thereof.

What is believed to be the best mode of the invention has been described above. However, it will be apparent to those skilled in the an that numerous variations of the type described could be made to the present invention without departing from the spirit of the invention. The scope of the present invention is defined by the broad general meaning of the terms in which the claims are expressed.

What is claimed is:

1. A wiring substrate comprising:
   a first alumina layer;
   a first metallized layer on the first alumina layer;
   a dielectric material layer on the first metallized layer;
   a cermet layer on the dielectric material layer;
   a second metallization layer on the cermet layer; and
   a second alumina layer on the second metallized layer;
   a first conductor electrically connecting to and extending from the second metallized layer through the second alumina layer; and
   a second conductor electrically extending from the first metallized layer through the cermet layer and dielectric material layer, through but not electrically connecting the first metallized layer, and through the second alumina layer.

2. A wiring substrate according to claim 1 wherein the first and second alumina layers contain greater than 85 vol. % alumina.

3. A wiring substrate according to claim 1 wherein the dielectric material comprises alumina and from 1 to 20 wt. % of the dielectric material of an auxiliary material.

4. A wiring substrate according to claim 1 wherein the dielectric material comprises a dielectric material selected from the group consisting of barium titanate, lead-zironate titanate, tantalate, niobate, zirconate, porcelain, glass and glass ceramics.

5. A wiring substrate according to claim 1 wherein the cermet material comprises alumina and from 5 to 50 wt. % of a metal selected from the group consisting molybdenum, tungsten, aluminum, silver, gold, palladium, magnesium, copper, iron, zinc, nickel, cobalt, titanium, and alloys thereof.

6. A wiring substrate according to claim 4 wherein the cermet material comprises alumina and from 5 to 50 wt. % of molybdenum.

7. A wiring substrate according to claim 4 wherein the cermet material comprises alumina and from 5 to 50 wt. % of molybdenum oxide.

8. A wiring substrate according to claim 4 wherein the cermet material comprises alumina and from 5 to 50 wt. % tungsten.

9. A wiring substrate according to claim 1 wherein the cermet material comprises alumina and from 5 to 50 wt. % tungsten oxide.

10. A wiring substrate according to claim 1 wherein the cermet material comprises alumina and from 5 to 50 wt. % of any combination of molybdenum, molybdenum oxide, tungsten, or tungsten oxide.

11. A wiring substrate according to claim 1 wherein the first metallized layer and the second metallized layer comprise primarily a metal which is combined with said substrate.

12. A wiring substrate according to claim 11 wherein the high melting point metal comprises molybdenum.

13. A wiring substrate according to claim 11 wherein the high melting point metal comprises tungsten.

* * * * *